United States Patent
Kraipak et al.

(10) Patent No.: US 8,607,023 B1
(45) Date of Patent: Dec. 10, 2013

(54) SYSTEM-ON-CHIP WITH DYNAMIC MEMORY MODULE SWITCHING

(75) Inventors: Waseem Saify Kraipak, Maharashtra (IN); George Bendak, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 589 days.

(21) Appl. No.: 12/763,110

(22) Filed: Apr. 19, 2010

Related U.S. Application Data

(63) Continuation-in-part of application No. 12/729,210, filed on Mar. 22, 2010, which is a continuation-in-part of application No. 12/687,817, filed on Jan. 14, 2010, which is a continuation-in-part of application No. 12/639,064, filed on Dec. 16, 2009.

(51) Int. Cl.
| | |
|---|---|
| *G06F 12/00* | (2006.01) |
| *G06F 13/00* | (2006.01) |
| *G06F 13/28* | (2006.01) |
| *G06F 9/26* | (2006.01) |
| *G06F 9/34* | (2006.01) |
| *G06F 1/00* | (2006.01) |

(52) U.S. Cl.
USPC .......................... 711/202; 711/170; 713/300

(58) Field of Classification Search
USPC ................... 711/170, 202; 713/300
See application file for complete search history.

(56) References Cited

U.S. PATENT DOCUMENTS

| | | | | |
|---|---|---|---|---|
| 7,100,013 | B1 * | 8/2006 | de Waal | 711/170 |
| 7,634,668 | B2 * | 12/2009 | White et al. | 713/300 |
| 2003/0206164 | A1 * | 11/2003 | Juenger | 345/211 |
| 2004/0039954 | A1 * | 2/2004 | White et al. | 713/322 |
| 2009/0234989 | A1 * | 9/2009 | Fischer | 710/56 |
| 2010/0161923 | A1 * | 6/2010 | GadelRab | 711/162 |
| 2010/0205467 | A1 * | 8/2010 | Park | 713/320 |

* cited by examiner

*Primary Examiner* — Michael Alsip
(74) *Attorney, Agent, or Firm* — Turocy & Watson, LLP

(57) ABSTRACT

A system and method are provided for using a system-on-chip (SoC) memory manager to dynamically shutdown and restart an off-chip memory module. After determining that a memory switch is to be enacted, an SoC memory switching core asserts a hold on processor operations. The memory switching core transfers data from a source memory module to a destination memory module. In a shutdown operation, data is transferred from a first memory module source to an external second memory module destination interfaced to the memory switching core. In a restart operation, data is transferred from the second memory module source to the first memory module destination. The memory switching core uses a memory map for translating the data addresses in the source memory module to data addresses in the destination memory module. Then, the memory switching core deasserts the hold on processor operations.

18 Claims, 7 Drawing Sheets

SYSTEM-ON-CHIP WITH DYNAMIC MEMORY MODULE SWITCHING

RELATED APPLICATIONS

This application is a Continuation-in-Part of a pending application entitled, SYSTEM-ON-CHIP WITH MEMORY SPEED CONTROL CORE, invented by Waseem Kraipak et al., Ser. No. 12/729,210, filed Mar. 22, 2010;

which is a Continuation-in-Part of a pending application entitled, SYSTEM-ON-CHIP WITH THERMAL MANAGEMENT CORE, invented by Waseem Kraipak et al., Ser. No. 12/687,817, filed Jan. 14, 2010;

which is a Continuation-in-Part of a pending application entitled, SYSTEM-ON-CHIP WITH FEEDBACK LOOP FOR PROCESSOR FREQUENCY CONTROL, invented by Waseem Kraipak et al., Ser. No. 12/639,064, filed Dec. 16, 2009. All the above-referenced applications are incorporated herein by reference.

BACKGROUND OF THE INVENTION

1. Field of the Invention

This invention generally relates to system-on-chip (SoC) off-SoC memory management and, more particularly, to a system and method for using a SoC hardware core to selectively enable off-SoC memories on-the-fly.

2. Description of the Related Art

As noted in Wikipedia, a memory controller is a digital circuit that manages the flow of data going to and from the main memory. The memory controller can be a separate chip or integrated into another chip, such as on the die of a microprocessor. Computers using Intel microprocessors have conventionally had a memory controller implemented on their motherboard's Northbridge, but some modern microprocessors, such as DEC/Compaq's Alpha 21364, AMD's Athlon 64 and Opteron processors, IBM's POWER5, Sun Microsystems UltraSPARC T1, and more recently, Intel Core i7 have a memory controller on the microprocessor die to reduce the memory latency. While this arrangement has the potential of increasing system performance, it locks the microprocessor to a specific type (or types) of memory, forcing a redesign in order to support newer memory technologies. When the memory controller is not on-die, the same CPU may be installed on a new motherboard, with an updated Northbridge.

The integration of the memory controller onto the die of the microprocessor is not a new concept. Some microprocessors in the 1990s such as the DEC Alpha 21066 and HP PA-7300LC had integrated memory controllers, but to reduce the cost of systems by removing the requirement for an external memory controller instead of increasing performance.

Memory controllers contain the logic necessary to read and write dynamic random access memory (DRAM), and to "refresh" the DRAM by sending current through the entire device. Without constant refreshes, DRAM loses the data written to it as the capacitors leak their charge within a fraction of a second (not less than 64 milliseconds according to JEDEC standards).

Reading and writing to DRAM is facilitated by use of multiplexers and demultiplexers, by selecting the correct row and column address as the inputs to the multiplexer circuit, where the demultiplexer on the DRAM can select the correct memory location and return the data (once again passed through a multiplexer to reduce the number of wires necessary to assemble the system).

Bus width is the number of parallel lines available to communicate with the memory cell. Memory controller bus widths range from 8-bit in earlier systems, to 512-bit in more complicated systems and video cards. Double data rate (DDR) memory controllers are used to drive DDR SDRAM, where data is transferred on the rising and falling edges of the memory clock. DDR memory controllers are significantly more complicated than Single Data Rate controllers, but allow for twice the data to be transferred without increasing the clock rate or increasing the bus width to the memory cell.

Dual channel memory controllers are memory controllers where the DRAM devices are separated onto two different buses, allowing two memory controllers to access them in parallel. This dual arrangement doubles the theoretical amount of bandwidth of the bus. In theory, more channels can be built (a channel for every. DRAM cell would be the ideal solution), but due to wire count, line capacitance, and the need for parallel access lines to have identical lengths, more channels are very difficult to add.

Fully buffered memory systems place a memory buffer device on every memory module (called an FB-DIMM when Fully Buffered RAM is used), which unlike conventional memory controller devices, use a serial data link to the memory controller instead of the parallel link used in previous RAM designs. This decreases the number of the wires necessary to place the memory devices on a motherboard (allowing for a smaller number of layers to be used, meaning more memory devices can be placed on a single board), at the expense of increasing latency (the time necessary to access a memory location). This latency increase is due to the time required to convert the parallel information read from the DRAM cell to the serial format used by the FB-DIMM controller, and back to a parallel form in the memory controller on the motherboard. In theory, the FB-DIMM's memory buffer device could be built to access any DRAM cells, allowing for memory cell agnostic memory controller design, but this has not been demonstrated, as the technology is in its infancy.

A DIMM, or dual in-line memory module, comprises a series of dynamic random access memory integrated circuits. These modules are mounted on a printed circuit board and designed for use in personal computers, workstations and servers. DIMMs began to replace SIMMs (single in-line memory modules) as the predominant type of memory module as Intel's Pentium processors began to gain market share.

The main difference between SIMMs and DIMMs is that DIMMs have separate electrical contacts on each side of the module, while the contacts on SIMMs on both sides are redundant. Another difference is that standard SIMMs have a 32-bit data path, while standard DIMMs have a 64-bit data path. Since Intel's Pentium has (as do several other processors) a 64-bit bus width, it requires SIMMs installed in matched pairs in order to complete the data bus. The processor would then access the two SIMMs simultaneously. DIMMs were introduced to eliminate this practice.

Serial ATA (SATA) is a computer bus interface for connecting host bus adapters to mass storage devices such as hard disk drives and optical drives. Serial ATA was designed to replace the older ATA (AT Attachment) standard (also known as EIDE). It is able to use the same low level commands, but serial ATA host-adapters and devices communicate via a high-speed serial cable over two pairs of conductors. In contrast, the parallel ATA (the redesignation for the legacy ATA specifications) used 16 data conductors each operating at a much lower speed. SATA offers several compelling advantages over the older parallel ATA (PATA) interface: reduced cable-bulk and cost (reduced from 80 wires to seven), faster and more efficient data transfer, and hot swapping.

The SATA host adapter is integrated into almost all modern consumer laptop computers and desktop motherboards. As of 2009, SATA has mostly replaced parallel ATA in all shipping consumer PCs. PATA remains in industrial and embedded applications dependent on Compactflash storage although the new CFast storage standard will be based on SATA.

Flash memory is a non-volatile computer storage that can be electrically erased and reprogrammed. It is a technology that is primarily used in memory cards and USB flash drives for general storage and transfer of data between computers and other digital products. It is a specific type of EEPROM (Electrically Erasable Programmable Read-Only Memory) that is erased and programmed in large blocks; in early flash the entire chip had to be erased at once. Flash memory costs far less than byte-programmable EEPROM and therefore has become the dominant technology wherever a significant amount of non-volatile, solid state storage is needed. Example applications include PDAs (personal digital assistants), laptop computers, digital audio players, digital cameras and mobile phones. It has also gained popularity in console video game hardware, where it is often used instead of EEPROMs or battery-powered static RAM (SRAM) for game save data.

Since flash memory is non-volatile, no power is needed to maintain the information stored in the chip. In addition, flash memory offers fast read access times (although not as fast as volatile DRAM memory used for main memory in PCs) and better kinetic shock resistance than hard disks. These characteristics explain the popularity of flash memory in portable devices. Another feature of flash memory is that when packaged in a "memory card," it is extremely durable, being able to withstand intense pressure, extremes of temperature, and even immersion in water.

Although technically a type of EEPROM, the term "EEPROM" is generally used to refer specifically to non-flash EEPROM which is erasable in small blocks, typically bytes. Because erase cycles are slow, the large block sizes used in flash memory erasing give it a significant speed advantage over old-style EEPROM when writing large amounts of data.

In summary, DIMMs are fast, consume relatively large amounts of power, and have a high bit density. Flash memories are slower than DIMMs, but faster than SATA or SSDs (solid state drives), consume less power, and have a lower memory density. SATA are mechanical, making them the slowest memory. They burn more power than a DIMM when active. However, a SATA drive has lots of storage and can be turned on and off, to save power, without losing data.

As noted above, most computing devices are currently built using DIMM type RAM memories. There are many occasions when a computing device is turned on, but not accessing memory. Keeping the DIMM memory "alive" in these conditions is wasteful of power. The power issue can be especially critical if the computing device is battery operated or sensitive to high operating temperatures. Currently, there is no technology able to shutdown or replace memory devices on-the-fly. Some problems that prevent such an operation include the possibility of data corruption, operating system inflexibility, and signal integrity or electrostatic discharge (ESD) issues. Even in the case when the operating system (OS) is hibernating, DIMMs cannot be removed, as the OS and the basic input/output system (BIOS) always look for the exact same memory state that existed prior to hibernation.

It would be advantageous if at least some of a computer device's memories could be put in a sleep mode when the system determines limited memory read/write access is required.

SUMMARY OF THE INVENTION

Described herein is a technique to shutdown a memory module on-the-fly, permitting a user to extend the runtime of the system while running on battery. This situation may occur, for example, when the user is traveling or making a presentation. This memory shutdown may even be used when the user is running Office applications, such as Word or PowerPoint, or checking emails, since these applications do not necessarily need access to the full memory.

The user can shut down one of the memory modules for deep power saving purpose and extended battery life. For instance, if the user is traveling and they know that they will be working mostly on the Office applications (MsWord, Excel, PowerPoint, or emails) and need to extend battery life. The user can click a hot key meant for deep power saving, which shuts down one of the memory modules on-the-fly. The system continues working with only one memory module without taking much of a performance hit. The machine does not need to be rebooted or the applications restarted. The memory shutdown happens in the background.

Otherwise a thermal control unit monitoring the memory modules may detect that there is a frequent heating issue with one of the memories that is not responding to initial thermal controls. In this case, data can be moved out of the problem memory module, and that memory shut down until it properly cools. After cooling, the memory module can be brought back online.

If there is a constant thermal issue with a particular memory module, or some other malfunction, the memory module can be shut down and replaced with a new memory module while the system is still in operation. There is no data loss, as the data is moved to a dedicated auxiliary storage location (flash, HDD, or Solid State Drive (SSD)). This feature is important for mission critical systems that need to have a 99.99999% uptime.

Accordingly, a method is provided for using a system-on-chip (SoC) memory manager to dynamically shutdown and restart an off-chip memory module. The SoC includes a processor, a memory controller interfaced to an external random access memory (RAM) first memory module, and a memory switching core. After determining that a memory switch is to be enacted, the memory switching core asserts a hold on processor operations. The memory switching core transfers data from a source memory module to a destination memory module. In a shutdown operation, data is transferred from the first memory module source to an external low power consumption second memory module destination interfaced to the memory switching core. In a restart operation, data is transferred from the second memory module source to the first memory module destination. The memory switching core uses a memory map for translating the data addresses in the source memory module to data addresses in the destination memory module. Then, the memory switching core deasserts the hold on processor operations.

Typically, the second memory module is a flash memory, a solid state drive (SSD), or a serial advanced technology attachment (SATA) memory. If the capacity of the first memory module is greater than the flash memory capacity, the memory switching core can transfer the data to a SSD or SATA memory in a shutdown operation. If the capacity of the first memory module is less than flash memory capacity, the data can be transferred to a flash memory.

If the first memory module has been shut down, and the memory controller receives a request for a first data block in the first memory module, the memory switching core uses the memory map to translate the first data block address in the first memory module to a first data block address in the second memory module. The memory switching core accesses the second memory module, and supplies the first data block on an SoC data bus.

Additional details of the above-described method, and a SoC with a memory management system to dynamically shutdown and restart an off-chip memory module, are provided below.

DETAILED DESCRIPTION

Figure 1:
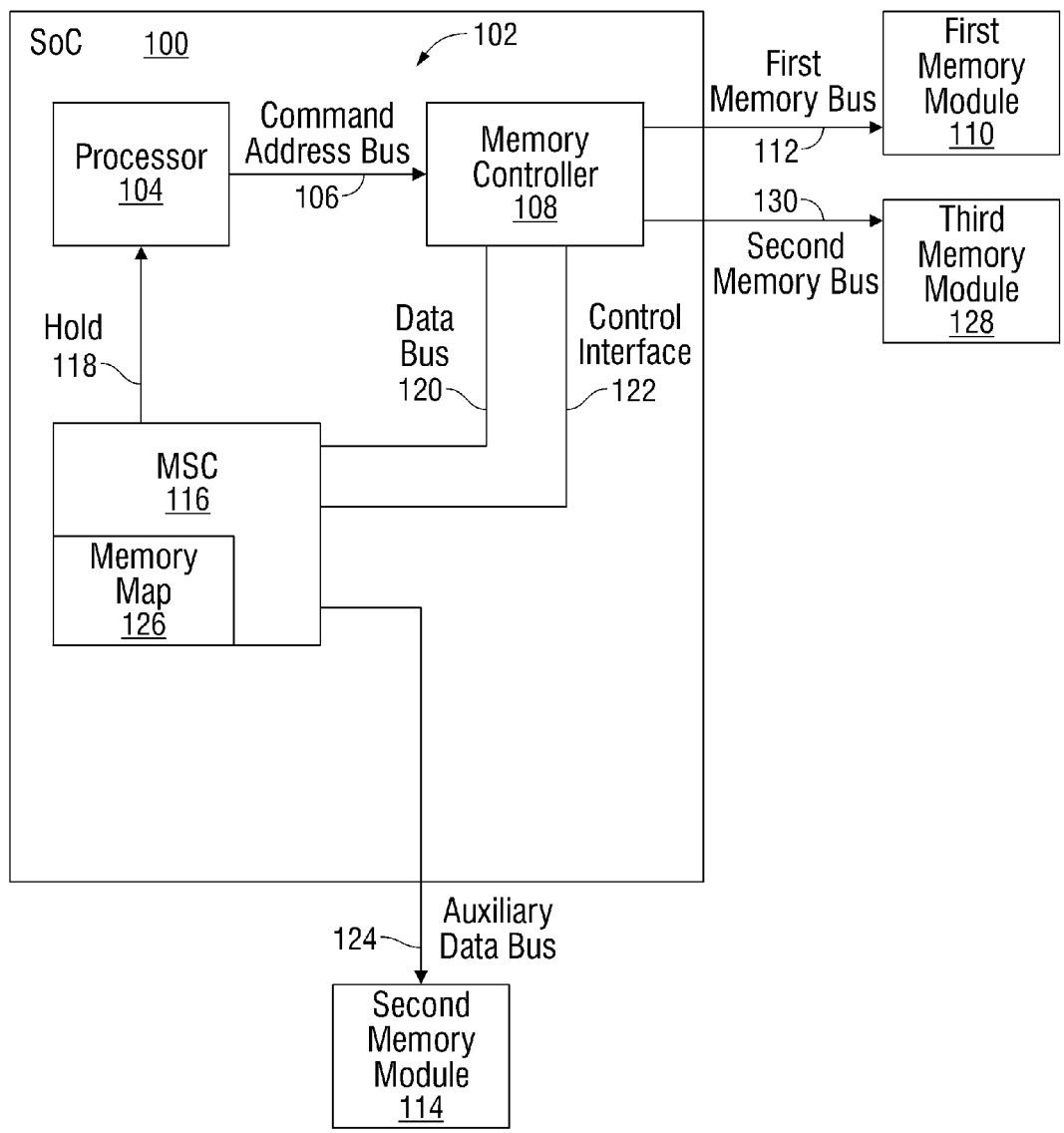
FIG. 1 is a schematic block diagram of a system-on-chip (SoC) with a memory management system to dynamically shutdown and restart an off-chip memory module.

FIG. 1 is a schematic block diagram of a system-on-chip (SoC) 100 with a memory management system to dynamically shutdown and restart an off-chip memory module. The memory management system 102 comprises a processor 104 connected to a command address bus on line 106. A memory controller 108 is interfaced to the processor 104 via the command address bus on line 106. An external (off-SoC) random access memory (RAM) first memory module 110 is interfaced to the memory controller 108 via a first memory bus on line 112. The system 102 also comprises an external (off-SoC) (typically low power consumption) second memory module 114. A memory switching core 116 has a hold interface on line 118 connected to the processor 104. The memory switching core (MSC) 116 is connected to the memory controller 108 via a data bus on line 120 and control interface on line 122. The MSC 116 is connected to the second memory module 114 via an auxiliary data bus on line 124. The MSC 116 is enabled as a hardware device.

The memory switching core 116 asserts a hold on processor operations in response to enacting a memory switch operation and desserts the hold when the memory switch operation is completed. The memory switching core 116 commands the transfer of data from a source memory module to a destination memory module. The data transfer operations can be either a shutdown or restart operation. A shutdown operation transfers data from the first memory module source 110 to the second memory module destination 114. The restart operation transfers data from the second memory module source 114 to the first memory module destination 110. A memory map 126 embedded in the memory switching core 116 translates the data addresses in the source memory module to data addresses in the destination memory module.

In one aspect as shown, an external (off-SoC) RAM third memory module 128 is connected to the memory controller 108 via a second memory bus on line 130. If memory switching core 116 enacts a shutdown operation (of the first memory module 110), the memory controller 108 changes processor memory access from interleaved access to the first memory module 110 and third memory module 128, to sequential access to the third memory module 128.

Alternately, if the memory switching core determines that a shutdown operation is desired, but that only the first memory module is interfaced to the memory controller (e.g., the third memory module is not present or not connected), the memory switching core 116 delivers a set of slow-operation parameters to the memory controller 108, to replace an initial set of parameters. Then, the memory controller 108 manages the first memory module 110 using the delivered set of parameters. One or more of the following memory control parameters may be delivered: column address strobe (CAS) latency (tAAmin), row address strobe (RAS) to CAS delay (tRCDmin), active to precharge delay time (tRAS min), active to active refresh delay time (tRC min), and combinations of the above-mentioned parameters. These parameters are well understood in the art. Details of a system able to change memory operation parameters are provided in parent application Ser. No. 12/729,210, which is incorporated herein by reference.

Figure 2:
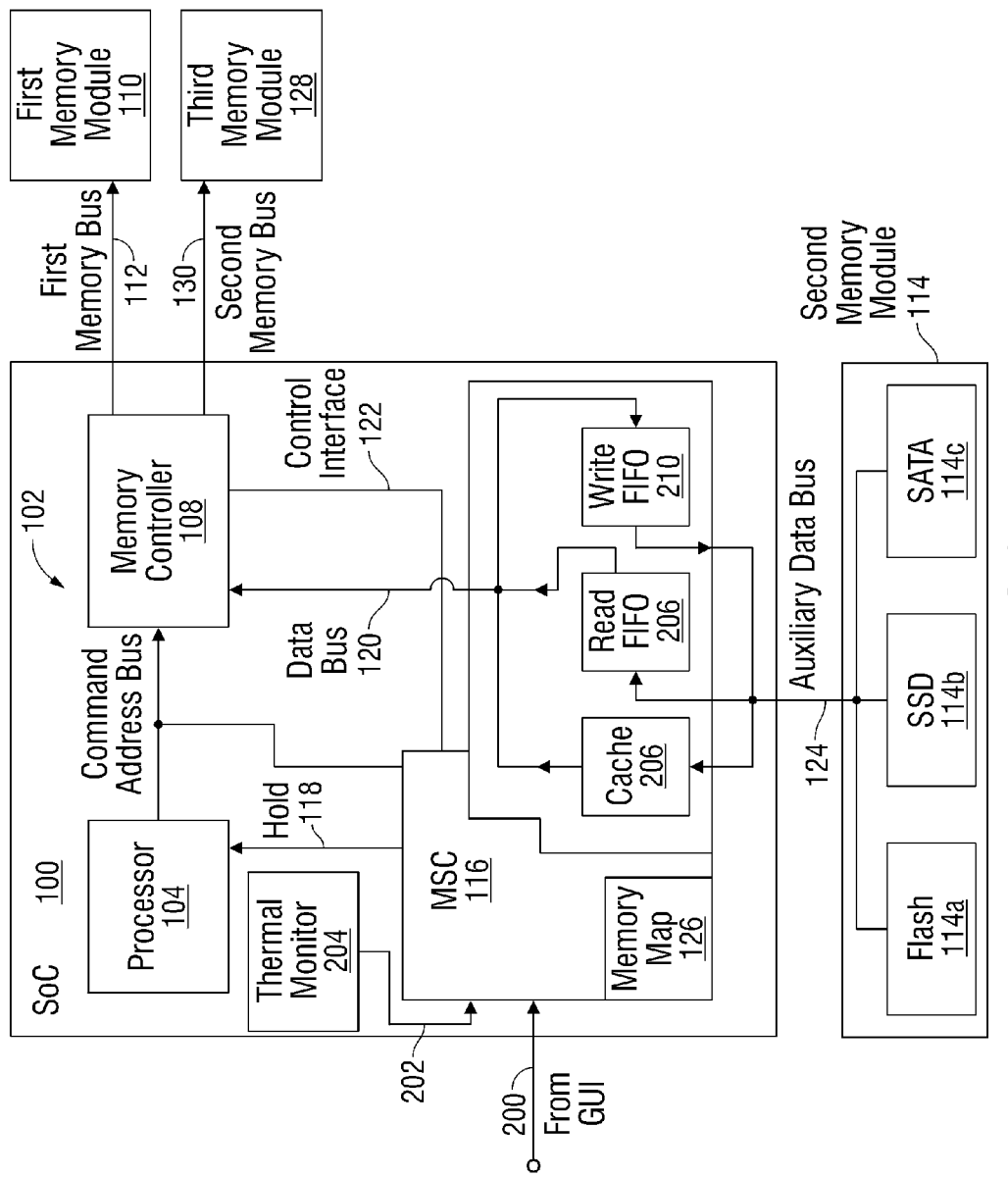
FIG. 2 is a schematic block diagram depicting additional details of the system presented in FIG. 1.

FIG. 2 is a schematic block diagram depicting additional details of the system presented in FIG. 1. In this aspect the second memory module 114 includes a flash memory 114a, a solid state drive (SSD) 114b, a serial advanced technology attachment (SATA) memory 114c. Although three memory components are shown connected in parallel on the auxiliary bus 124, it should be understood that the second memory module may comprise just one of the depicted modules, or any combination of the above-mentioned devices. In a shutdown operation, the memory switching core 116 transfers data to the second memory 114 by determining the capacity of the first memory module 110. If the capacity of the first memory module 110 is greater than the flash memory capacity 114a, it transfers the data to either the SSD memory 114b (if present) or the SATA memory 114c (if present). But if the capacity of the first memory module 110 is less than the flash memory 114a capacity, the MSC 116 can transfer the data to the flash memory. As noted above in the Background, a flash memory conventionally uses less energy than SATA or SSD. Note: the decision to transfer data to a particular module need not necessarily be made on the basis of capacity. Power consumption is another factor to be considered.

In another aspect the memory switching core 116 has a command interface, and the MSC enacts the shutdown operation in response to receiving a trigger message from a graphical user interface (GUI) connected to the SoC on line 200. The GUI, not shown, is typically a software application of instructions stored in a computer readable memory that are executed by a processor. The trigger message may also be supplied on line 202 as a thermal warning from an SoC-embedded thermal monitor 204. Details of a thermal monitoring system are provided in parent application Ser. No. 12/687,817, which is incorporated herein by reference. Alternately, the trigger can be an error detection message on line 122 from the memory controller 108, or from a software application (not shown) enabled as a sequence of instructions, stored in memory, and executed by a processor.

Subsequent to the hold being deasserted on the processor 104, the processor is still able to access data originally stored in the first memory module 110, even after the first memory module has been shut down. Thus, if the memory controller 108 receives a request from the processor 104 for a first data block in the first memory module 110, the memory switching core 116 uses the memory map 126 to translate the first data block address in the first memory module 110 to a first data block address in the second memory module 114. The MSC 116 then accesses the second memory module 114, and supplies the first data block on the data bus 120.

Typically, a cache 206 is embedded in the memory switching core 116. The memory switching core 116 initially checks for the first data block in the cache 206, and if the first data block is present in the cache, it supplies the first data block on the data bus 120 from the cache. Then, the memory switching core 116 loads the cache 206 with data blocks associated with a first plurality of addresses in the second memory module 114, sequentially following the first data block address.

A read first-in first-out (FIFO) 208 may also be embedded in the memory switching core 116, interposed between the data bus 120 and auxiliary bus 124. If the first data block is not in cache 206, the memory switching core 116 supplies the first data block on the data bus by accumulating portions of the first data block in the read FIFO 208 and transferring the accumulated portions from the read FIFO to the data bus 120 (and to the cache 206 so that subsequent fetches can be served by the cache).

Subsequent to the first memory module shutdown and the hold being deasserted on the processor 104, the memory controller 108 may receive a request from the processor 104 to write a second data block in the first memory module 110. The memory switching core 116 saves the second data block in the second memory module 114 and uses the memory map 126 to translate the second data block address in the second memory module 114 to a second data block address in the first memory module 110.

In one aspect, a write FIFO 210 is embedded in the memory switching core 116, interposed between the data bus 120 and auxiliary bus 124. The memory switching core 116 saves the second data block in the second memory module 114 by accumulating portions of the second data block in the write FIFO 210 and transfers the accumulated portions from the write FIFO 210 to the second memory module 114.

As used in this application, the term "core" refers to an integrated circuit die of connected hardware sub-components that supply electrical signals in response to electrical signal stimuli. While these electrical signals may be indirectly affected by software operations performed external to die, there is no software application internal to the die indirectly generating electrical signals. Any logic functions performed internal to the core are the result of a hardware-based state machine type logic.

Functional Description

Figure 3:
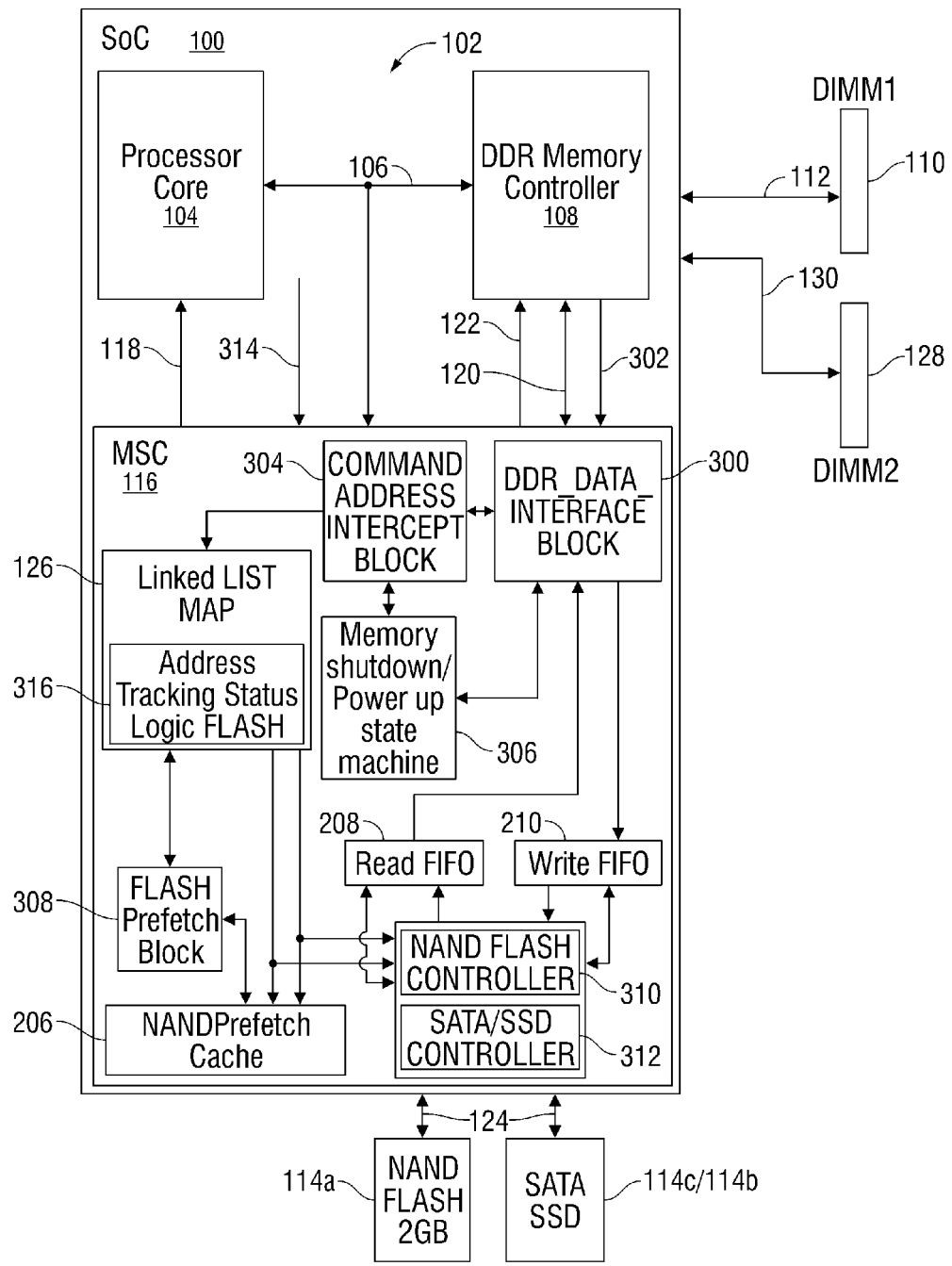
FIG. 3 is a schematic block diagram depicting additional details of the system presented in FIG. 2.

FIG. 3 is a schematic block diagram depicting additional details of the system presented in FIG. 2. A double data rate (DDR) controller 108 is connected to two DIMMS, 110 and 128. For clarity, memory controller 108 is shown as one block but it actually contains two sub-blocks, one dedicated to each DIMM. The DDR memory controller 108 is connected with the DDR_data-interface block 300, with interfaces cntrl1 122, data-bus 120, and transaction done 302 signals.

The command/address intercept block 304 intercepts the DDR command and address on line 106, and monitors commands between the processor and memory controller. The memory shutdown/power up state machine 306 is the main state machine. It has the function of shutting down a memory module and also bringing it back up.

Figure 4:
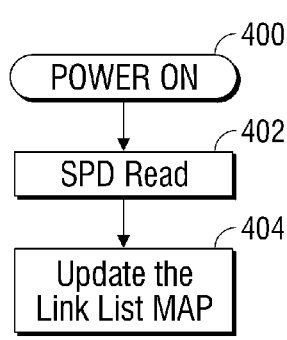
FIG. 4 is a flowchart illustrating a linked list map update/initialization algorithm.

The linked list map block 126 remaps the physical addresses of the memory module that has been shut down to the NAND flash memory, SATA, or SSD address space. The link list map block also indicates whether an address that is being translated can be found in the prefetch cache 206. The flash prefetch block 308 moves data from the second memory 114 to the prefetch cache 206 before the read request to that block comes from the core 104. The NAND flash controller 310 controls the data movement to and from the NAND flash 114a. It should be noted that the flash memory type is not limited to NAND flash and can be NOR flash as well. SATA/SSD controller 312 controls data flow to and from the SATA and SSD memories 114c/114b FIG. 4 is a flowchart illustrating a linked list map update/initialization algorithm. The system is powered on in Step 400. In Step 402 the BIOS reads the serial presence detect (SPD) of the DIMM and in Step 404 this information is stored in the configuration register of the link list map unit. The SPD is a small non-volatile memory on the DIMM, which contains DIMM information such as memory capacity and operating frequency. The link list map unit keeps the information concerning how many DIMMs are populated and the total available memory on the platform.

Returning to FIG. 3, the power_saving_mode signal asserted by the core 104 on line 314, by a GUI (line 200, FIG. 2), or a thermal monitor (line 202, FIG. 2) indicates a request for the deep power saving mode, in which the memory shutdown state machine 306 is activated.

Figure 5:
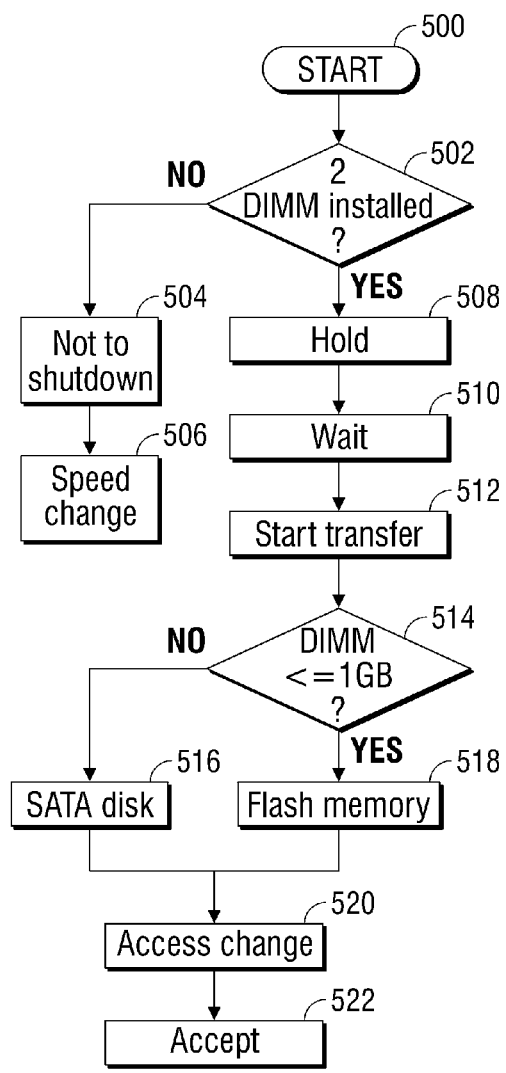
FIG. 5 is a flowchart illustrating a memory shutdown algorithm.

FIG. 5 is a flowchart illustrating a memory shutdown algorithm. In Step 500 a power savings or shutdown operation is initiated. In Step 502 a decision is made as to whether there are 2 DIMMs connected to the system. If not, Step 504 does not shutdown the single DIMM, but Step 506 changes the speed operating parameters. Referencing FIG. 3, after power-on the BIOS reads the SPD regarding the memory information. If it finds that the system is populated with only one DIMM, the state machine 306 enters to the not_to_shutdown state, and initiates a speed change. In this state the speed change logic (not shown) is activated and the memory controller is configured for a lower speed.

If 2 DIMMs are detected, Step 508 asserts a hold on the processor core, and the memory controller does not accept any new memory transactions. Step 510 waits for any current, already initiated memory transactions to complete. Once the transactions are over, the memory controller asserts the transaction_done signal (line 302 of FIG. 3). Step 512 begins the data transfer process.

Step 514 determines the capacity of the memory being shut down. If the capacity is greater than that of a flash memory (1 gigabit in this example), Step 516 selects a SATA (or SSD) memory. Alternately, Step 518 accepts the flash memory. Either way, the linked list map unit copies the memory contents to the destination memory, and creates a virtual address map linking the source and destination memories.

More explicitly (see FIG. 3), the link list map unit 126 asserts an address and read command to the DDR memory controller 108. The DDR memory controller 108 intercepts this command and starts reading the contents from the DIMM 110. The data is sent on the data_bus 120 through the DDR data interface block 300 and is stored into the write FIFO 208. The write FIFO 208 is more likely to be used if the destination is the flash memory 114a, and if the flash controller 310 operates slowly. A complete block of data is copied from the memory 110 and stored in the write FIFO 208. The NAND flash controller 310 reads the FIFO 208 and stores the data in flash memory 114a. Once all the contents are copied into the flash, the memory shutdown algorithm moves to access change state.

Step 520 changes the memory access from interleaved to sequential. The memory shut down state machine 306 first shuts down DIMM 110 and then reconfigures the access to memory as sequential. The normal, interleaved mode, ping-pongs between the DIMMs. The sequential mode accesses the lone operating memory 128. Step 522 deasserts the processor hold. The memory controller is now ready to accept new memory transaction commands.

To illustrate the operation of the device after a DIMM has been shutdown, example read and write requests from the core are described below. In a read request the processor core sends a read request to the memory controller requesting new data from the memory. The command and intercept block 306 in the MSC 116 intercepts every request. If this request is for the data that has been moved from the DIMM to the NAND flash, the link list map unit 126 converts the physical address into the NAND flash address. The address tracking block 316 looks for this address in the NAND prefetch cache 206. If the address is in the cache, the data is moved from the cache 206 to the core 104. If the data is not present in the cache 206, then the flash prefetch logic 308 requests the data from the NAND flash controller 310. The NAND controller 310 reads data from flash 114a and moves it to the core 104. The prefetch unit 308 reads ahead and requests the next few cache lines from the NAND controller 310. This data is kept in the cache, and if the core 104 requests these addresses, the link list map 126 reads them from the cache, which saves time and boost the performance.

In a write request the core 104 sends a write request to the memory controller 108 requesting new data to be committed to memory. The command and intercept block 304 intercepts every request. If this request is for the first DIMM's (110) address range, then the link list map unit 126 converts the physical address into a NAND flash address (assuming the data has been transferred to flash memory). The link list map unit 126 sends a write request with the data to the NAND controller 310. The NAND controller 310 writes this data into the flash 114a. To speed up the write performance from the core side, the write requests can be queued into the write FIFO 210.

In another scenario, the system is populated with two DIMMs, but there is a constant thermal issue or other malfunction associated with DIMM 110. A user can use a GUI to replace the faulty DIMM on-the-fly. The shutdown of DIMM 110 has been explained above. Since the bus 112 to DIMM 110 is in an inactive state, removing the DIMM does not create any electrical disturbances.

Figure 6:
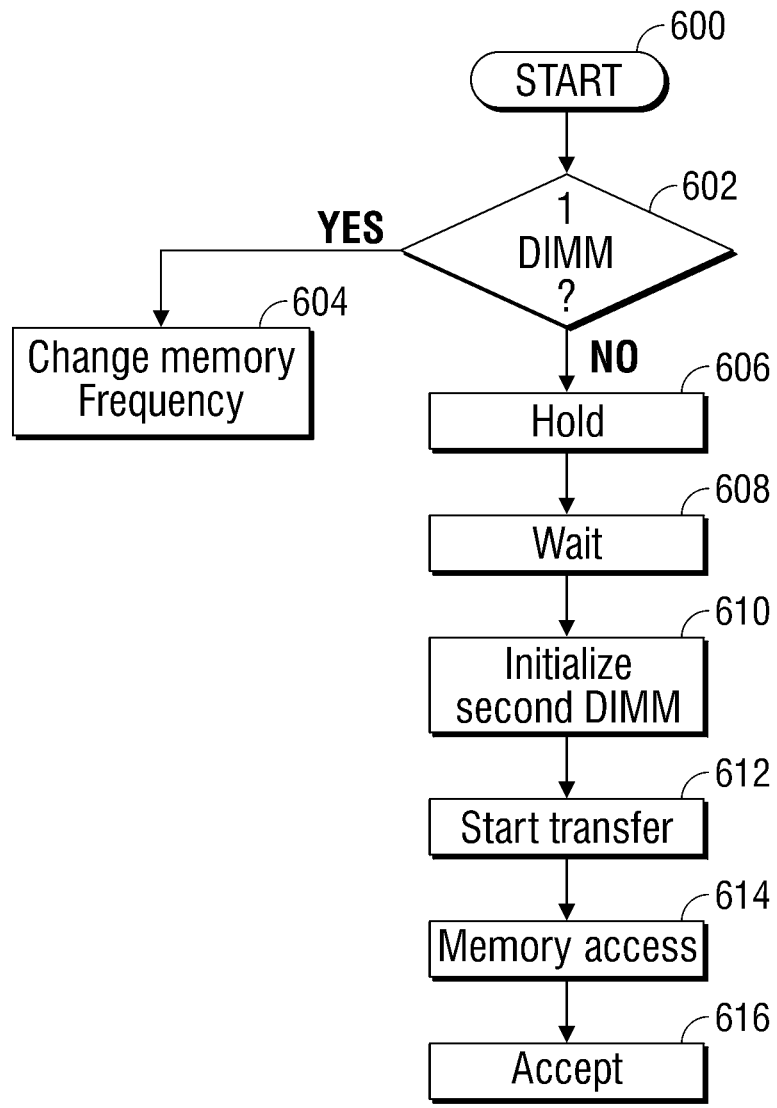
FIG. 6 is a flowchart illustrating an algorithm for bringing the system memories back to normal operation.

FIG. 6 is a flowchart illustrating an algorithm for bringing the system memories back to normal operation. In Step 600 a memory_power_up signal is asserted. In Step 602 the state machine 306 of FIG. 3 monitors the signal "slow_speed_set". This signal is set at power-on if only one DIMM is detected. If only one DIMM is indicated, the algorithm goes to Step 604, where the speed of the single DIMM is increased. If the one_DIMM_shut signal is asserted at power-up, then the system is populated with two DIMMs, and a decision was previously made to shut down one of the DIMMs.

In Step 606 the state machine 306 asserts the hold signal to core 104. In Step 608 the state machine waits for any current transactions to complete. In Step 610 the state machine instructs the DDR controller to reinitialize the timing parameters to the DIMM that was previously shut down, and waits until the memory is powered. Some memory pattern tests may be run to determine if the restarted memory is operational. In Step 612 the state machine starts a read request to the NAND or SATA/SSD controller, and starts moving the data back to the DIMM. In Step 614 the DDR controller is programmed to change memory access from sequential to interleaved. In Step 616 the hold signal is deasserted and the core starts working with both DIMMS in a conventional manner.

Figure 7A:
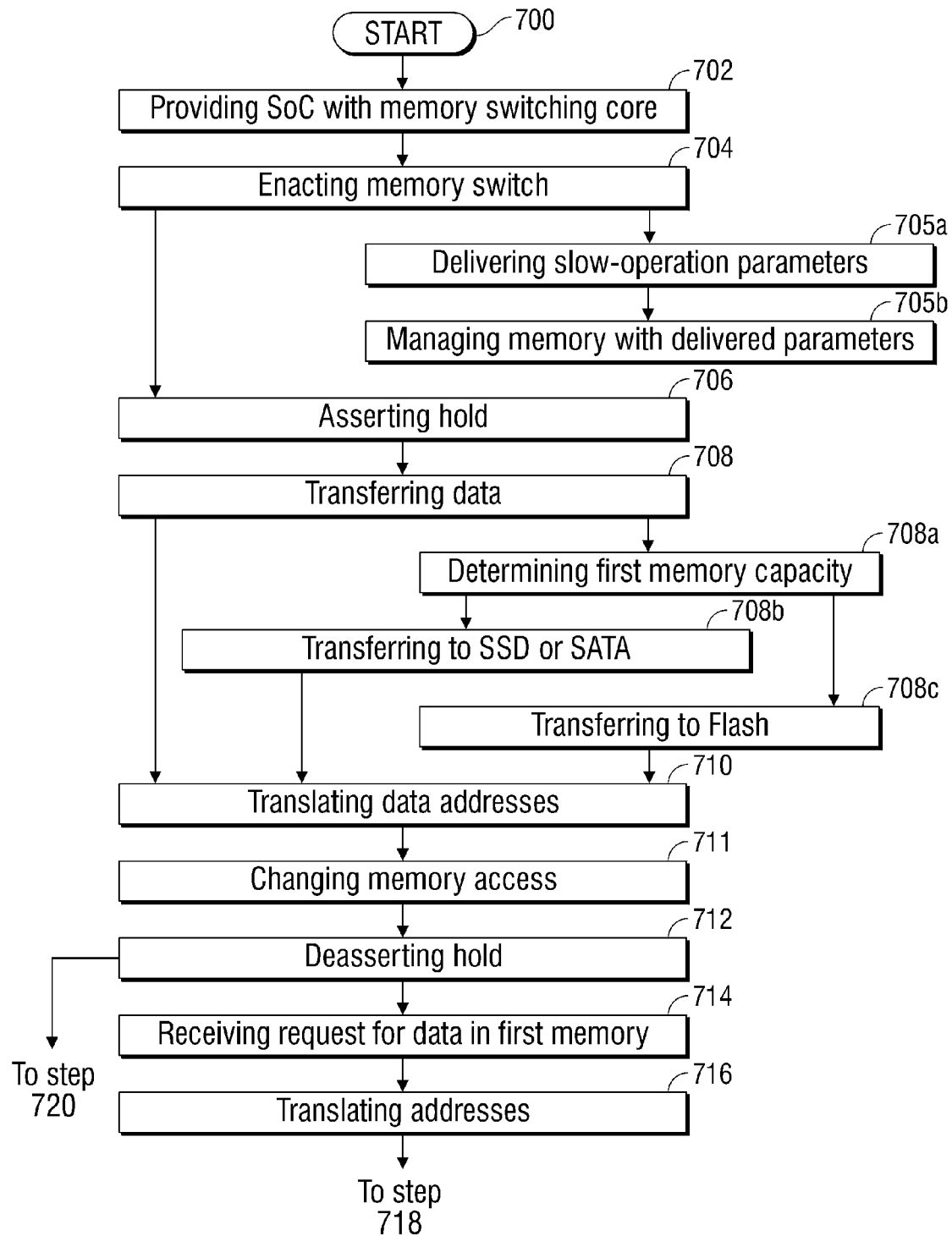
FIGS. 7A and 7B are a flowchart illustrating a method for using a SoC memory manager to dynamically shutdown and restart an off-chip memory module.
Figure 7B:
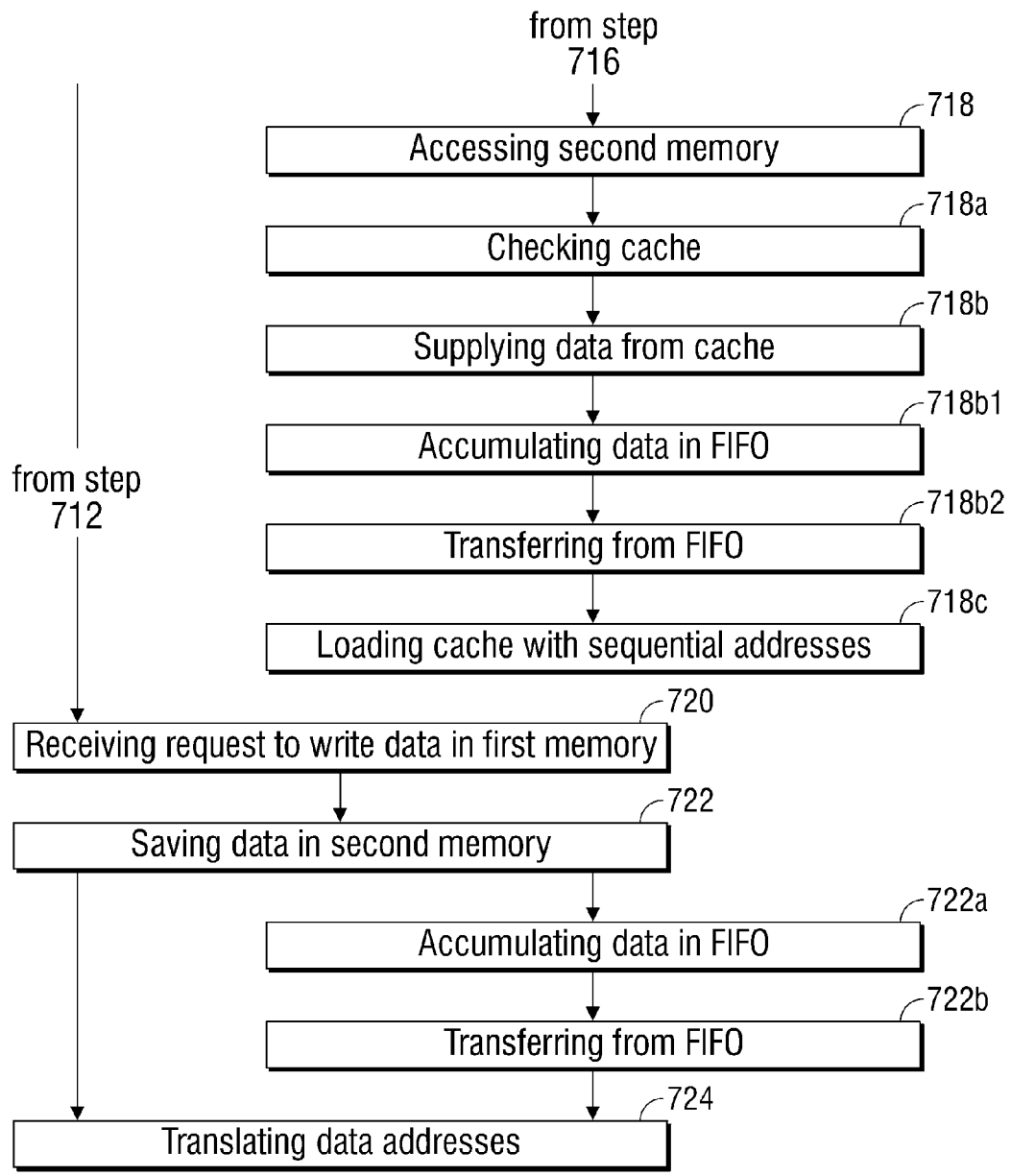

FIGS. 7A and 7B are a flowchart illustrating a method for using a SoC memory manager to dynamically shutdown and restart an off-chip memory module. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 700.

Step 702 provides an SoC with a processor, a memory controller interfaced to an external (RAM) first memory module, and a memory switching core. Step 704 determines if a memory switch is to be enacted. In Step 706 the memory switching core asserts a hold on processor operations. In Step 708 the memory switching core transfers data from a source memory module to a destination memory module in either a shutdown or restart operation. A shutdown operation transfers data from the first memory module source to an external second memory module destination interfaced to the memory switching core. A restart operation transfers data from the second memory module source to the first memory module destination. In Step 710 the memory switching core uses a memory map for translating the data addresses in the source memory module to data addresses in the destination memory module. In Step 712 the memory switching core deasserts the hold on processor operations.

In one aspect, Step 702 provides an SoC with a memory controller interfaced with an external RAM third memory module and Step 704 determines a shutdown operation. A shutdown operation may be enacted, for example, as the result of a trigger message from GUI connected to the SoC, a thermal warning from an SoC-embedded thermal monitor, and an error detection message from the memory controller, or an error detection message from a software application enabled as a sequence of instructions, stored in memory, and executed by a processor. Then in Step 711, subsequent to remapping the data addresses in Step 710, the memory controller changes processor memory access from interleaved access to the first and third memory modules, to sequential access to the third memory module.

Alternately, Step 704 may determine that a shutdown operation is desired, but that only the first memory module is interfaced to the memory controller. Then, Step 705a delivers a set of slow-operation parameters to the memory controller, to replace an initial set of parameters. In Step 705b the memory controller manages the first memory module using the delivered set of parameters.

In one aspect where a shutdown operation has been initiated, Step 708 may transfer data to second memory module flash memory, SSD, or SATA memory, with the following substeps. Step 708a determines the capacity of the first memory module. If the capacity of the first memory module is greater than the flash memory capacity, Step 708b transfers the data to either an SSD or SATA memory. If the capacity of the first memory module is less than the flash memory capacity, Step 708c transfers the data to the flash memory.

In Step 714, subsequent to deasserting the hold on the processor (Step 712), the memory controller receives a request for a first data block in the first memory module. In Step 716 the memory switching core uses the memory map to translate the first data block address in the first memory module to a first data block address in the second memory module. In Step 718 the memory switching core accesses the second memory module, and supplies the first data block on an SoC data bus.

In one aspect, accessing the second memory module in Step 718 includes substeps. Step 718a initially checks a memory switching core cache. If the first data block is present in the cache, Step 718b supplies the first data block on the SoC data bus from the cache. Step 718c loads the cache with data blocks associated with a first plurality of addresses in the second memory module, sequentially following the first data block address.

Supplying the first data block on the SoC data bus in Step 718b may include the following substeps. Step 718b1 accumulates portions of the first data block in a memory switching core read FIFO. Step 718b2 transfers the accumulated portions from the read FIFO to the data bus.

In Step 720, subsequent to deasserting the hold on the processor (Step 712), the memory controller receives a request to write a second data block in the first memory module. In Step 722 the memory switching core saves the second data block in the second memory module. In Step 724 the memory switching core uses the memory map to translate the second data block address in the second memory module to a second data block address in the first memory module.

Saving the second data block in the second memory module in Step 722 may include the following substeps. Step 722a accumulates portions of the second data block in a memory switching core write FIFO. Step 722b transfers the accumulated portions from the write FIFO to the second memory module.

A system and method have been provided for using a SoC memory manager to dynamically shutdown and restart an off-chip memory module. Examples of particular message structures, processors, and hardware units have been presented to illustrate the invention. However, the invention is not limited to merely these examples. Other variations and embodiments of the invention will occur to those skilled in the art.

We claim:

1. A method for using a system-on-chip (SoC) memory manager to dynamically shutdown and restart an off-chip memory module, comprising:
    providing an SoC with a processor, a memory controller interfaced to a first memory module, and a memory switching core;
    determining if a memory switch is to be enacted;
    the memory switching core asserting a hold on processor operations;
    the memory switching core transferring data from a source memory module to a destination memory module based on which operation is selected from a shutdown operation and a restart operation, where the shutdown operation transfers data from the first memory module to a second memory module interfaced to the memory switching core, and the restart operation transfers the data from the second memory module to the first memory module;
    the memory switching core using a memory map for translating data addresses in the source memory module to data addresses in the destination memory module; and,
    the memory switching core deasserting the hold on the processor operations;
    wherein transferring the data comprises
        determining a capacity of the first memory module;
        transferring the data to the second memory module comprising a flash memory, and a solid state drive (SSD) or a serial advanced technology attachment (SATA) memory comprising:
            if the capacity of the first memory module is greater than a flash memory capacity of the flash memory, transferring the data to the SSD or the SATA memory; and,
            if the capacity of the first memory module is less than the flash memory capacity of the flash memory, transferring the data to the flash memory.

2. The method of claim 1 wherein providing the SoC includes providing the SoC with the memory controller interfaced with a third memory module;
    wherein determining if the memory switch is to be enacted includes determining the shutdown operation; and,
    the method further comprising:
    subsequent to remapping the data addresses, the memory controller changing processor memory access from interleaved access to the first memory module and the third memory module, to sequential access to the third memory module.

3. The method of claim 2 wherein determining the shutdown operation includes the memory switching core receiving a trigger message selected from a group consisting of a message for a graphical user interface (GUI) connected to the SoC, a thermal warning from an SoC-embedded thermal monitor, and an error detection message from the memory controller, and an error detection message from a software application enabled as a sequence of instructions, stored in memory, and executed by the processor.

4. The method of claim 2 further comprising:
    subsequent to deasserting the hold on the processor, the memory controller receiving a request for a first data block in the first memory module;
    the memory switching core using the memory map to translate a first data block address in the first memory module to a first data block address in the second memory module; and,
    the memory switching core accessing the second memory module, and supplying the first data block on an SoC data bus.

5. The method of claim 4 wherein the memory switching core accessing the second memory module includes:
    initially checking a memory switching core cache;
    if the first data block is present in the memory switching core cache, supplying the first data block on the SoC data bus from the memory switching core cache; and,
    loading the memory switching core cache with data blocks associated with a first plurality of addresses in the second memory module, sequentially following the first data block address.

6. The method of claim 5 wherein supplying the first data block on the SoC data bus includes:
    accumulating portions of the first data block in a memory switching core read first-in first-out (FIFO); and,
    transferring the accumulated portions from the read FIFO to the SoC data bus.

7. The method of claim 2 further comprising:
    subsequent to deasserting the hold on the processor, the memory controller receiving a request to write a second data block in the first memory module;
    the memory switching core saving the second data block in the second memory module;

the memory switching core using the memory map to translate a second data block address in the second memory module to a second data block address in the first memory module.

8. The method of claim 7 wherein saving the second data block in the second memory module includes:
accumulating portions of the second data block in a memory switching core write FIFO; and,
transferring the accumulated portions from the write FIFO to the second memory module.

9. The method of claim 1 wherein determining if the memory switch is to be enacted includes:
determining that the shutdown operation is desired; and,
determining that only the first memory module is interfaced to the memory controller; and,
the method further comprising:
delivering a set of slow-operation parameters to the memory controller, to replace an initial set of parameters; and,
the memory controller managing the first memory module using the delivered set of parameters.

10. A system-on-chip (SoC) with a memory management system to dynamically shutdown and restart an off-chip memory module, comprising:
a processor connected to a command address bus;
a memory controller interfaced to the processor via the command address bus;
a first memory module interfaced to the memory controller via a first memory bus;
a second memory module;
a memory switching core having a hold interface connected to the processor, a data bus and control interface connected to the memory controller, and an auxiliary data bus connected to the second memory module, the memory switching core asserting a hold on processor operations in response to enacting a memory switch operation and deasserting the hold when the memory switch operation is completed, the memory switching core commanding the transfer of data from a source memory module to a destination memory module based on which an operation is selected from a shutdown operation and a restart operation, where the shutdown operation transfers the data from the first memory module to the second memory module, and the restart operation transfers data from the second memory module to the first memory module; and,
a memory map embedded in the memory switching core for translating the data addresses in the source memory module to data addresses in the destination memory module;
the second memory module includes a flash memory, a solid state drive (SSD), and a serial advanced technology attachment (SATA) memory, in parallel on the auxiliary data bus;
the memory switching core transfers data to the second memory module by determining a capacity of the first memory module, and if the capacity of the first memory module is greater than a flash memory capacity of the flash memory, transfers the data to a memory of the SSD or the SATA memory, and if the capacity of the first memory module is less than the flash memory capacity, transfers the data to the flash memory.

11. The memory management system of claim 10 further comprising:
a third memory module connected to the memory controller via a second memory bus;
wherein the memory switching core enacts the shutdown operation;
wherein the memory controller changes processor memory access from interleaved access to the first memory module and the third memory module, to sequential access to the third memory module.

12. The memory management system of claim 11 wherein the memory switching core has a command interface, and enacts the shutdown operation in response to receiving a trigger message selected from a group consisting of a message for a graphical user interface (GUI) connected to the SoC, a thermal warning from an SoC-embedded thermal monitor, and an error detection message from the memory controller, and an error detection message from a software application enabled as a sequence of instructions, stored in memory, and executed by the processor.

13. The memory management system of claim 11 wherein the memory controller, subsequent to the hold being deasserted on the processor, receives a request from the processor for a first data block in the first memory module; and,
wherein the memory switching core uses the memory map to translate a first data block address in the first memory module to a first data block address in the second memory module, accesses the second memory module, and supplies the first data block on the data bus.

14. The memory management system of claim 13 further comprising:
a cache embedded in the memory switching core;
wherein the memory switching core initially checks for the first data block in the cache, and if the first data block is present in the cache, supplies the first data block on the data bus from the cache; and,
wherein the memory switching core loads the cache with data blocks associated with a first plurality of addresses in the second memory module, sequentially following the first data block address.

15. The memory management system of claim 14 further comprising:
read first-in first-out (FIFO) embedded in the memory switching core and interposed between the data bus and auxiliary bus; and,
wherein the memory switching core supplies the first data block on the data bus by accumulating portions of the first data block in the read FIFO and transferring the accumulated portions from the read FIFO to the data bus.

16. The memory management system of claim 11 wherein the memory controller, subsequent to the hold being deasserted on the processor, receives a request from the processor to write a second data block in the first memory module; and,
wherein the memory switching core saves the second data block in the second memory module and uses the memory map to translate a second data block address in the second memory module to a second data block address in the first memory module.

17. The memory management system of claim 16 further comprising:
a write FIFO embedded in the memory switching core and interposed between the data bus and auxiliary bus; and,
wherein the memory switching core saves the second data block in the second memory module by accumulating portions of the second data block in the write FIFO and transferring the accumulated portions from the write FIFO to the second memory module.

18. The memory management system of claim 10 wherein the memory switching core determines that the shutdown operation is desired, but that only the first memory module is interfaced to the memory controller, the memory switching core delivering a set of slow-operation parameters to the memory controller, to replace an initial set of parameters; and,
  wherein the memory controller manages the first memory module using the delivered set of parameters.

* * * * *